United States Patent
Ueyama et al.

(10) Patent No.: US 10,720,276 B2
(45) Date of Patent: Jul. 21, 2020

(54) CHIP INDUCTOR

(71) Applicant: Murata Manufacturing Co., Ltd., Kyoto-fu (JP)

(72) Inventors: Hiroya Ueyama, Nagaokakyo (JP); Akihiro Ono, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 110 days.

(21) Appl. No.: 15/788,843

(22) Filed: Oct. 20, 2017

(65) Prior Publication Data

US 2018/0166206 A1 Jun. 14, 2018

(30) Foreign Application Priority Data

Dec. 14, 2016 (JP) .................................. 2016-241773

(51) Int. Cl.
*H01F 5/00* (2006.01)
*H01F 27/29* (2006.01)
(Continued)

(52) U.S. Cl.
CPC ....... *H01F 27/292* (2013.01); *H01F 17/0013* (2013.01); *H01F 27/32* (2013.01);
(Continued)

(58) Field of Classification Search
CPC .... H01F 5/003; H01F 17/0013; H01F 27/292; H01F 27/32; H01F 27/2804; H01F 27/29;
(Continued)

(56) References Cited

U.S. PATENT DOCUMENTS 6,154,114 A * 11/2000 Takahashi ........... H01F 17/0013
336/200
6,198,375 B1    3/2001 Shafer
(Continued)

FOREIGN PATENT DOCUMENTS

CN      1296628 A    5/2001
CN    104282420 A    1/2015
(Continued)

OTHER PUBLICATIONS

An Office Action; "Notification of Reasons for Refusal," mailed by the Japanese Patent Office dated Feb. 19, 2019, which corresponds to Japanese Patent Application No. 2016-241773 and is related to U.S. Appl. No. 15/788,843; with English language translation.

*Primary Examiner* — Mang Tin Bik Lian
(74) *Attorney, Agent, or Firm* — Studebaker & Brackett PC

(57) ABSTRACT

In a multilayer body including a plurality of laminated insulating material layers on which a plurality of coil patterns are provided, the plurality of coil patterns are connected to each other to form a coil having a coil axis parallel to a lamination direction. A pair of outer electrodes connected to the coil are disposed at both ends in the lamination direction. When a direction orthogonal to the lamination direction is defined in an up-down direction, the coil patterns are disposed within the multilayer body so as to be shifted to an upper side. At least a portion of a vertical projection image of the coil on a virtual plane orthogonal to the lamination direction does not overlap a vertical projection image of the outer electrodes on the virtual plane.

6 Claims, 12 Drawing Sheets

(51) Int. Cl.
  *H01F 17/00* (2006.01)
  *H01F 27/32* (2006.01)
  *H05K 1/18* (2006.01)
(52) U.S. Cl.
  CPC ..... *H05K 1/181* (2013.01); *H05K 2201/1003* (2013.01); *H05K 2201/10636* (2013.01)
(58) Field of Classification Search
  CPC ............ H01F 2027/2809; H05K 1/181; H05K 2201/10636; H05K 2201/1003
  USPC ................................ 336/200, 223, 233, 192
  See application file for complete search history.

(56) References Cited

U.S. PATENT DOCUMENTS

| | | | | |
|---|---|---|---|---|
| 6,218,925 | B1* | 4/2001 | Iwao | H01F 17/0013 336/200 |
| 6,304,164 | B1* | 10/2001 | Ohno | H01F 17/0006 336/200 |
| 2005/0122699 | A1* | 6/2005 | Maeda | H01F 17/0013 361/793 |
| 2013/0015937 | A1* | 1/2013 | Seko | H01F 17/0013 336/200 |
| 2014/0145815 | A1* | 5/2014 | Ishii | H01F 17/0013 336/200 |
| 2014/0253277 | A1* | 9/2014 | Takezawa | H01F 27/2804 336/200 |
| 2014/0333405 | A1* | 11/2014 | Choto | H01F 1/401 336/200 |
| 2015/0009003 | A1 | 1/2015 | Ozawa et al. | |
| 2016/0042858 | A1* | 2/2016 | Park | H01F 17/0013 336/200 |
| 2016/0099100 | A1* | 4/2016 | Park | H01F 17/0013 336/200 |
| 2016/0141102 | A1* | 5/2016 | Tseng | H01F 41/042 336/192 |
| 2017/0018351 | A1* | 1/2017 | Yatabe | H01F 27/2804 |

FOREIGN PATENT DOCUMENTS

| | | |
|---|---|---|
| JP | H09-148143 A | 6/1997 |
| JP | 2000138120 A | 5/2000 |
| JP | 2000228308 A | 8/2000 |
| JP | 2000235932 A | 8/2000 |
| JP | 2002-260925 A | 9/2002 |
| JP | 2002270428 A | 9/2002 |
| JP | 2005-045103 A | 2/2005 |

* cited by examiner

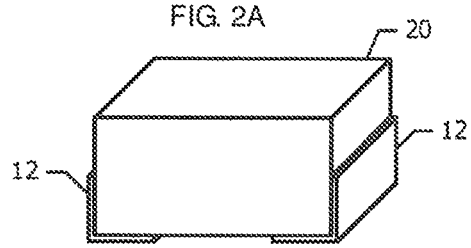
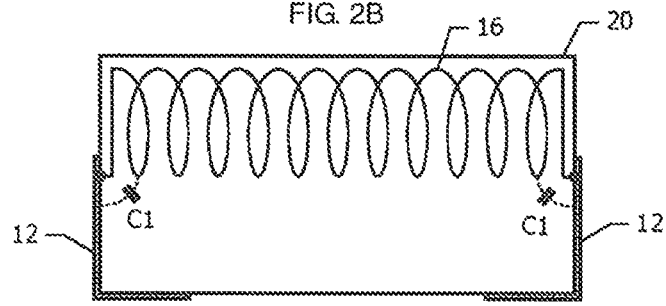
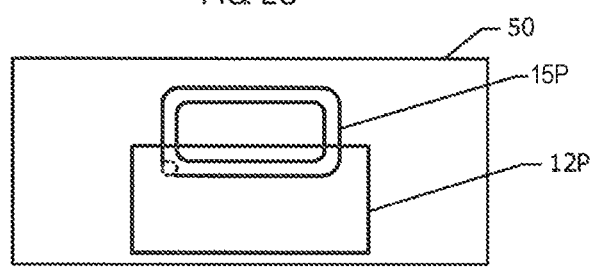
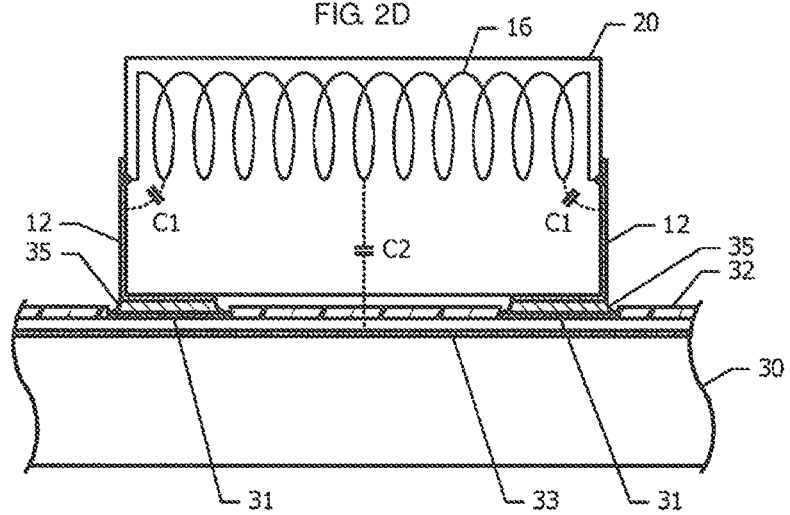

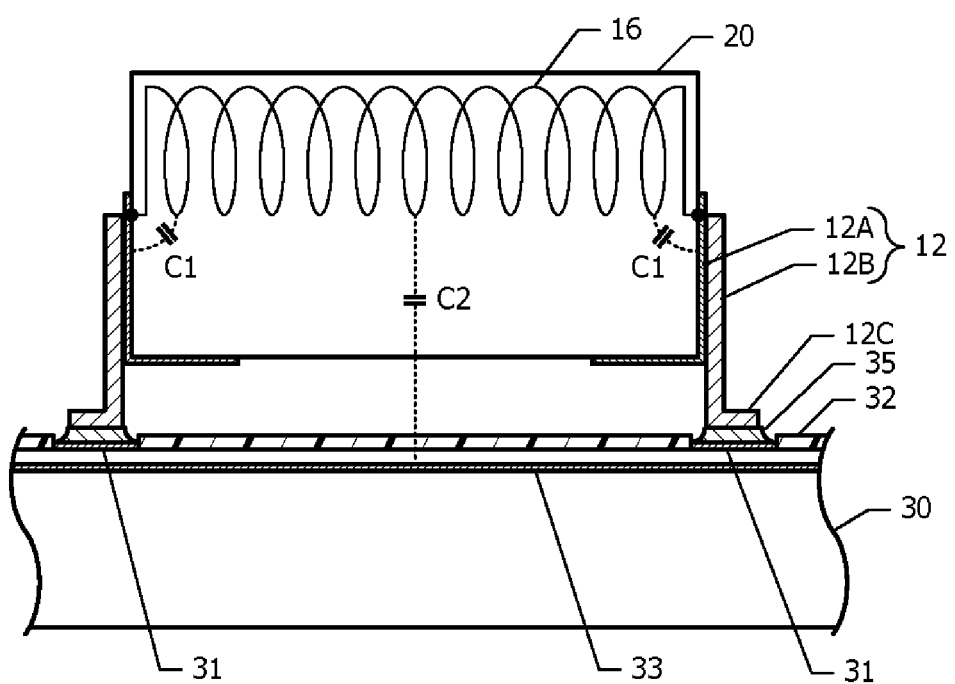

CHIP INDUCTOR

CROSS REFERENCE TO RELATED APPLICATIONS

This application claims benefit of priority to Japanese Patent Application 2016-241773 filed Dec. 14, 2016, the entire content of which is incorporated herein by reference.

TECHNICAL FIELD

The present disclosure relates to a chip inductor.

BACKGROUND

Because of size reduction of a chip inductor, a coil and a mounting board on which the coil is mounted are close to each other. When the coil and the mounting board are close to each other, the interaction between the coil and a conductor pattern on the mounting board increases.

Japanese Unexamined Patent Application Publication No. 2005-45103 discloses a chip inductor in which a Q-value is increased by decreasing the degree of linkage of a magnetic flux generated by a coil to a conductor pattern on a mounting board. The chip inductor includes a multilayer body composed of a plurality of laminated insulating layers on which coil conductor patterns are formed. The plurality of coil conductor patterns are continuous between the insulating layers and form one coil. Terminal electrodes are provided at both end portions of the multilayer body in a direction perpendicular to the lamination direction of the multilayer body, and extended portions at both ends of the coil are connected to the terminal electrodes. The chip inductor is mounted on the mounting board in an attitude in which the lamination direction (coil axis direction) is perpendicular to the mounting board.

When the surface of the multilayer body that faces the mounting board is referred to as lower surface, the coil is disposed at a position shifted to the upper side of the multilayer body. Since the distance between the coil and the mounting board is increased, the degree of linkage of the magnetic flux generated by the coil to the conductor pattern on the mounting board decreases. As a result, it is possible to increase the Q-value of the inductor.

Japanese Unexamined Patent Application Publication No. 2002-260925 also discloses a chip inductor in which a coil is disposed so as to be shifted to the upper side. According to this configuration, the stray capacitance between the coil and a circuit board or an outer electrode of the chip inductor is reduced, and thus the resonant frequency is increased. As a result, the frequency characteristics of the inductance are improved.

Japanese Unexamined Patent Application Publication No. 9-148143 discloses a mounting structure in which a mounting board is provided with a cavity that faces a mounted position of a choke coil and that has dimensions having a width at least equal to or larger than the width of the choke coil and a length equal to or larger than the length of a coil portion of the choke coil. By providing a ground pattern around the cavity, air having a dielectric constant lower than the dielectric constant of the mounting board is present in the gap between the mounting board and the choke coil, so that it is possible to reduce a stray capacitance component.

When the number of windings of the coil is increased in a configuration in which the coil is located so as to be shifted to the upper side of the multilayer body and in an attitude in which the coil axial direction and the mount surface of the mounting board are perpendicular to each other, the dimension of an element in a height direction is increased. On the other hand, in the case of avoiding an increase in the dimension in the height direction, since it is not possible to increase the number of windings of the coil, it is difficult to obtain a high inductance.

In the configuration in which the cavity is provided in the mounting board, it is not possible to dispose a wire at a position corresponding to the cavity, and thus a wiring-enabled region of the mounting board becomes narrow. Furthermore, a manufacturing step of forming the cavity in the mounting board is required, and thus there is a disadvantage in terms of manufacturing cost.

SUMMARY

Accordingly, it is an object of the present disclosure to provide a chip inductor that allows reduction of a stray capacitance generated at a mounting board and an element assembly of the chip inductor.

A chip inductor according to a first aspect of the present disclosure includes:
  a multilayer body including a plurality of laminated insulating material layers on which a plurality of coil patterns are provided, the plurality of coil patterns being connected to each other to form a coil having a coil axis parallel to a lamination direction; and
  a pair of outer electrodes disposed at both ends in the lamination direction, respectively, and connected to the coil, wherein
  when a direction orthogonal to the lamination direction is defined in an up-down direction, the coil patterns are disposed within the multilayer body so as to be shifted to an upper side, and
  at least a portion, at the upper side, of a vertical projection image of the coil on a virtual plane orthogonal to the lamination direction does not overlap a vertical projection image of the outer electrodes on the virtual plane.

Since the coil patterns are disposed so as to be shifted to the upper side with respect to the mount surface when the chip inductor is mounted on a mounting board such that the lower side of the chip inductor faces the mounting board, the distance between the coil and the mounting board is large. Thus, it is possible to reduce a stray capacitance between the coil and a conductor provided in or on the mounting board. As compared to a configuration in which the entirety of a vertical projection image of the coil on the virtual plane orthogonal to the lamination direction overlaps a vertical projection image of the outer electrodes on the virtual plane, it is possible to reduce a stray capacitance between the coil and each outer electrode. Furthermore, components intersecting the outer electrodes, of a magnetic flux generated by the coil, are reduced. Accordingly, it is possible to suppress an increase in the Q-value due to an eddy current.

In a chip inductor according to a second aspect of the present disclosure, in addition to the configuration of the chip inductor according to the first aspect, the pair of outer electrodes are disposed so as to be shifted to a lower side based on the multilayer body and are formed on surfaces of the multilayer body at both ends in the lamination direction.

Since the coil and the outer electrodes are disposed so as to be shifted to the sides opposite to each other, it is possible to reduce the stray capacitance occurring between the coil and each outer electrode.

In a chip inductor according to a third aspect of the present disclosure, in addition to the configuration of the chip inductor according to the first or second aspect, the coil and the outer electrodes are connected to each other at a lower side with respect to a lowermost end of the coil patterns in the lamination direction.

Since the coil and each outer electrode are connected to each other at the lower side with respect to the lowermost end of the coil patterns, it is possible to shift the upper end of each outer electrode to the lower side as compared to a structure in which the coil is connected to each outer electrode at the lowermost end of the coil patterns. When the upper end of each outer electrode is shifted to the lower side, it is possible to decrease the stray capacitance between the coil and each outer electrode.

In a chip inductor according to a fourth aspect of the present disclosure, in addition to the configurations of the chip inductors according to the first to third aspects, the coil is connected to the outer electrodes at a center portion of the coil in a width direction orthogonal to both the lamination direction and the up-down direction.

When a multilayer body in which a plurality of chip inductors are distributed in a matrix manner, are cut into individual chip inductors, even if a cutting position is shifted in the width direction, an event in which the cutting position overlaps a location of connection between the coil and the outer electrode is less likely to occur. Accordingly, it is possible to suppress a decrease in the reliability due to the cutting position overlapping the location of connection between the coil and the outer electrode.

In a chip inductor according to a fifth aspect of the present disclosure, in addition to the configurations of the chip inductors according to the first to fourth aspects, the pair of outer electrodes include a pair of conductive members connected to the coil, each of the conductive members includes a fixed portion fixed to a mounting board, and the multilayer body is supported by the mounting board in a state where the multilayer body is spaced apart from the mounting board at an interval, when the fixed portion is fixed to the mounting board.

Since a gap is ensured between the multilayer body and the mounting board, it is possible to make the coil away from the mounting board. Accordingly, it is possible to reduce the stray capacitance between the coil and the conductor in or on the mounting board.

In a chip inductor according to a sixth aspect of the present disclosure, in addition to the configurations of the chip inductors according to the first to fifth aspects, a dimension in the up-down direction of the multilayer body is larger than a dimension thereof in a width direction orthogonal to the lamination direction.

Because of this configuration, it is possible to make the coil further away from the mounting board. As a result, it is possible to further decrease the stray capacitance between the coil and the conductor in or on the mounting board.

Other features, elements, characteristics and advantages of the present disclosure will become more apparent from the following detailed description of preferred embodiments of the present disclosure with reference to the attached drawings.

BRIEF DESCRIPTION OF THE DRAWINGS

FIG. 2A is a perspective view of the chip inductor according to the first embodiment.

FIG. 2B is a schematic cross-sectional view of the chip inductor.

FIG. 2C is a diagram showing a vertical projection image of a coil and a vertical projection image of outer electrodes on a virtual plane orthogonal to a lamination direction.

FIG. 2D is a schematic cross-sectional view of a state where the chip inductor is mounted on a mounting board.

FIG. 10 is a schematic cross-sectional view of a state where a chip inductor according to a third embodiment is mounted on a mounting board.

DETAILED DESCRIPTION

First Embodiment

A chip inductor according to a first embodiment will be described with reference to FIGS. 1 to 4C.

Figure 1:
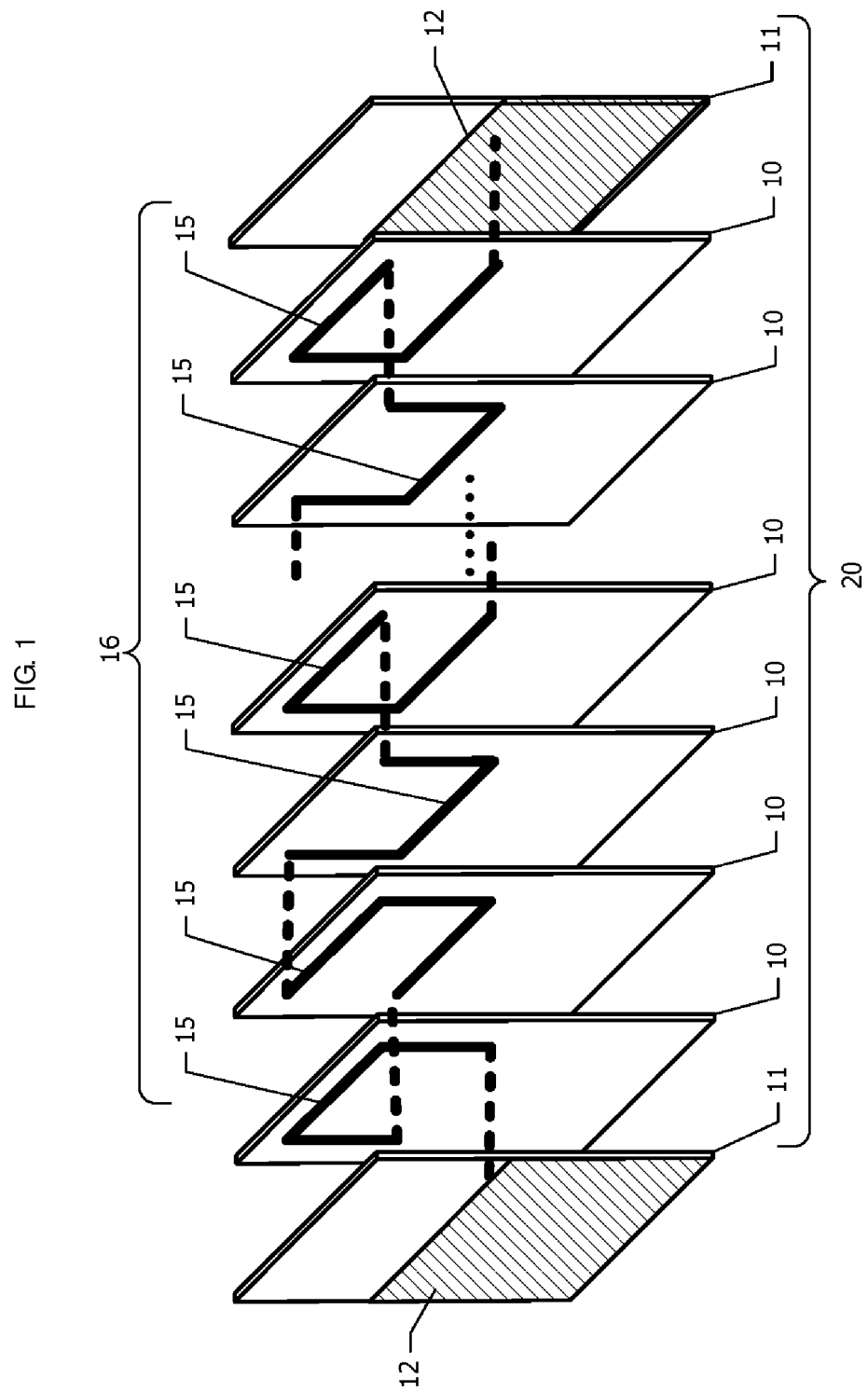
FIG. 1 is an exploded perspective view of a chip inductor according to a first embodiment.

FIG. 1 is an exploded perspective view of the chip inductor according to the first embodiment. A plurality of insulating material layers 10 on which a plurality of coil patterns 15 composed of conductors are provided are laminated. The plurality of coil patterns 15 provided on the plurality of insulating material layers 10 are connected to each other to form a coil 16. The plurality of coil patterns 15 are connected to each other in the lamination direction via vias provided in the insulating material layers 10. The coil axis of the coil 16 is parallel to the lamination direction.

An insulating material layer 11 on which an outer electrode 12 is provided is disposed at each side, in the lamination direction, of a multilayer body 20 including the coil patterns 15 and the insulating material layers 10. A pair of the outer electrodes 12 are connected to both ends of the coil 16 via vias provided in the insulating material layers 10 and 11.

The coil patterns 15 are disposed within the multilayer body 20, which includes the insulating material layers 10 and 11, so as to be shifted in a direction orthogonal to the lamination direction (the upward direction in FIG. 1). The outer electrodes 12 are disposed so as to be shifted in a direction opposite to the direction in which the coil patterns 15 are shifted (the downward direction in FIG. 1).

Next, an example of a production method for the multilayer body 20 will be described. First, ferrite green sheets that are to be the insulating material layers 10 are prepared. Via holes for mutually connecting the coil patterns 15 adjacent to each other in the lamination direction are formed in the ferrite green sheets. The coil patterns 15 are printed on the ferrite green sheets in which the via holes have been formed. The ferrite green sheets on which the coil patterns 15 have been formed are stacked and pressure-bonded. A plurality of the pressure-bonded ferrite green sheets are cut into a chip. The cut chip is fired, and barrel polishing of the fired chip is performed. Finally, the outer electrodes 12 are formed by means of plating or the like.

FIG. 2A is a perspective view of the chip inductor according to the first embodiment. The chip inductor has a substantially rectangular parallelepiped outer shape. The longitudinal direction of the rectangular parallelepiped corresponds to the lamination direction of the insulating material layers 10 shown in FIG. 1. The height direction of the rectangular parallelepiped corresponds to the up-down direction in FIG. 1, and the coil patterns 15 shown in FIG. 1 are disposed so as to be shifted to the upper side in FIG. 2A. The dimension in the longitudinal direction (lamination direction) of the chip inductor is larger than the dimension in the height direction and the dimension in the width direction thereof.

The outer electrode 12 is formed on each end surface in the lamination direction. The outer electrode 12 is disposed so as to be shifted to the lower side of the end surface, and covers a partial region of the bottom surface of the multilayer body 20. The outer electrode 12 is formed, for example, by plating a base electrode formed from a material containing silver (Ag) or the like as a principal component, with nickel (Ni) or tin (Sn). The outer electrode 12 may extend to a part of the side surface of the multilayer body 20.

FIG. 2B is a schematic cross-sectional view of the chip inductor. The coil 16 is disposed within the multilayer body 20 so as to be shifted to the upper side. Each outer electrode 12 is formed in a region shifted to the lower side of each end surface of the multilayer body 20 (at the side opposite to the direction in which the coil 16 is shifted, on the basis of the multilayer body 20). Each outer electrode 12 also covers a region of the bottom surface of the multilayer body 20 near each end. The outer electrodes 12 are electrically connected to both ends of the coil 16. A stray capacitance C1 occurs between the coil 16 and each outer electrode 12.

FIG. 2C is a diagram showing a vertical projection image 15P of the coil patterns 15 and a vertical projection image 12P of the outer electrodes 12 on a virtual plane 50 orthogonal to the lamination direction. The vertical projection image 15P of the coil patterns 15 on the virtual plane 50 has a substantially annular shape. At least a portion of the vertical projection image 15P does not overlap the vertical projection image 12P of the outer electrodes 12. Particularly, a portion, at the upper side, of the vertical projection image 15P does not overlap the vertical projection image 12P of the outer electrodes 12.

FIG. 2D is a schematic cross-sectional view of a state where the chip inductor according to the first embodiment is mounted on a mounting board 30. A plurality of lands 31 for mounting are provided on a mount surface (upper surface) of the mounting board 30. The region of the mount surface other than the lands 31 is covered with a protective insulating film 32 that is composed of a solder resist or the like. The chip inductor is mounted on the mounting board 30 by the outer electrodes 12, which are formed on the bottom surface of the multilayer body 20 of the chip inductor, and the lands 31 being connected to each other by means of solder 35. A conductor 33 such as a wire or a ground plane is disposed within the mounting board 30 or on the surface of the mounting board 30. A stray capacitance C2 occurs between the conductor 33 and the coil 16.

Advantageous Effects of First Embodiment

Next, superior effects of the chip inductor according to the first embodiment will be described in comparison with a comparative example shown in FIGS. 3A and 3B.

In the first embodiment, the chip inductor is mounted in an attitude in which the coil axis of the coil 16 is parallel to the mount surface of the mounting board 30. Thus, it is possible to increase the number of windings of the coil 16 without increasing the dimension in the height direction of the chip inductor. It is possible to produce a chip inductor having a high inductance by increasing the number of winding of the coil 16.

As shown in FIG. 2D, the coil 16 is disposed so as to be shifted to the upper side of the multilayer body 20, and thus the distance between the coil 16 and the conductor 33 in or on the mounting board 30 is longer than that in the case where the coil 16 is disposed so as not to be shifted in any of the upward direction or the downward direction. As a result, it is possible to reduce the stray capacitance C2 between the conductor 33 and the coil 16. In addition, it is not necessary to provide an aperture in the first embodiment, unlike a structure for reducing a stray capacitance by providing a cavity or the like in a region of the mounting board 30 directly below the chip inductor. Thus, it is possible to dispose the conductor 33 in the region within the mounting board 30 directly below the chip inductor. That is, an effect that the region where it is possible to dispose the conductor 33 such as a wire or a ground plane becomes wide, is achieved.

Figure 3A:
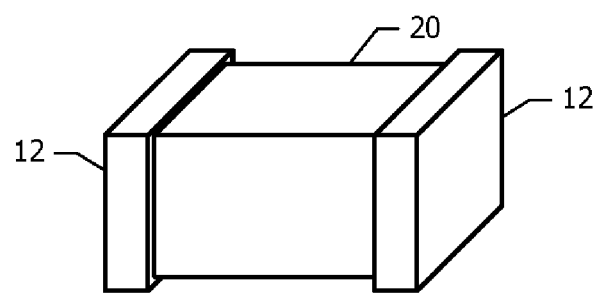
FIG. 3A is a perspective view of a chip inductor according to a comparative example.
Figure 3B:
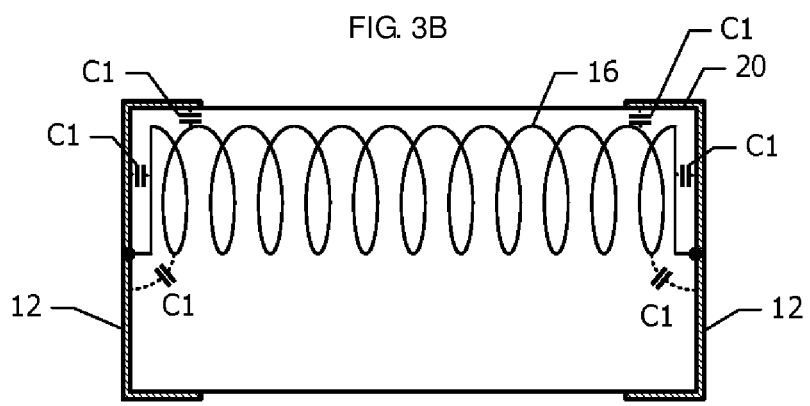
FIG. 3B is a schematic cross-sectional view of the chip inductor according to the comparative example.

FIGS. 3A and 3B are a perspective view and a schematic cross-sectional view of a chip inductor according to the comparative example, respectively. In the first embodiment, as shown in FIG. 2A, each outer electrode 12 is formed on two surfaces, that is, the end surface and the bottom surface of the multilayer body 20. In the comparative example, each outer electrode 12 is disposed over the entirety of each end surface of the multilayer body 20 and also covers portions of the upper surface, the bottom surface, and the side surfaces of the multilayer body 20. That is, each outer electrode 12 is disposed on five surfaces of the multilayer body 20.

In the comparative example, each outer electrode 12 is disposed over the entire region of the end surface of the multilayer body 20 as shown in FIG. 3B, and thus the stray capacitance C1 occurring between the coil 16 and the outer electrode is higher than the stray capacitance C1 (FIG. 2B) in the first embodiment.

In the first embodiment, as compared to the comparative example shown in FIGS. 3A and 3B, it is possible to reduce the stray capacitance C1 occurring between the coil 16 and each outer electrode 12. Since it is possible to reduce the stray capacitance C1 between the coil 16 and each outer electrode 12 and the stray capacitance C2 between the coil 16 and the conductor 33 in or on the mounting board 30, the high frequency characteristics of the chip inductor are improved.

For example, when the chip inductor according to the first embodiment is used as a choke coil, it is possible to reduce leak of a high-frequency signal via the stray capacitance. Accordingly, it is possible to inhibit (choke) transmission of a signal in a higher frequency band.

An eddy current occurs in a conductor disposed within a high frequency magnetic field. The eddy current reduces the Q-value of a chip inductor. In the chip inductor according to the comparative example shown in FIGS. 3A and 3B, almost all components of a magnetic flux generated by the coil 16 intersect the outer electrodes 12. On the other hand, in the chip inductor according to the first embodiment shown in FIG. 2B, only part of components of a magnetic flux generated by the coil intersects the outer electrodes 12. In the chip inductor according to the first embodiment, since less components of the magnetic flux intersect the outer electrodes 12, it is possible to suppress a decrease in the Q-value due to an eddy current.

In the first embodiment, the dimension in the up-down direction (height direction) of the chip inductor is preferably increased. For example, the dimension in the up-down direction is preferably made larger than the dimension in the width direction orthogonal to the lamination direction. When the dimension in the up-down direction is increased, it is possible to make the coil 16 further away from the mounting board 30, and thus it is possible to further decrease the stray capacitance C2 (FIG. 2D) between the conductor 33 in or on the mounting board 30 and the coil 16.

Results of Measurement of High Frequency Characteristics of Chip Inductor According to Reference Example In order to confirm an effect achieved when the outer electrodes 12 (FIG. 2A, FIG. 2B) are disposed so as to be shifted to the lower side, the high frequency characteristics of chip inductors according to reference examples were measured with reference to FIGS. 4A to 5C. Next, the results of the measurement will be described.

Figure 4A:
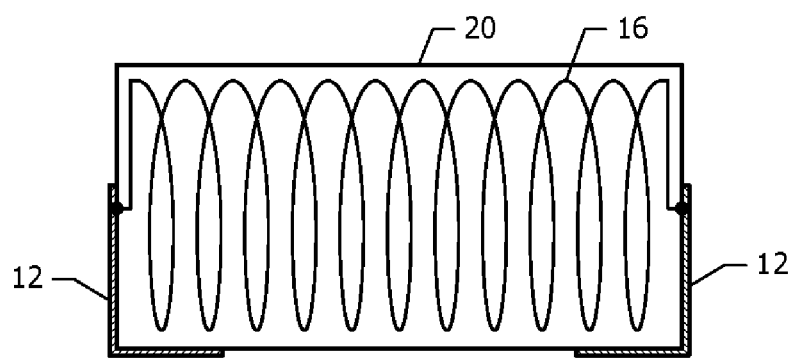
FIG. 4A is a schematic cross-sectional view of a chip inductor according to a first reference example.
Figure 4B:
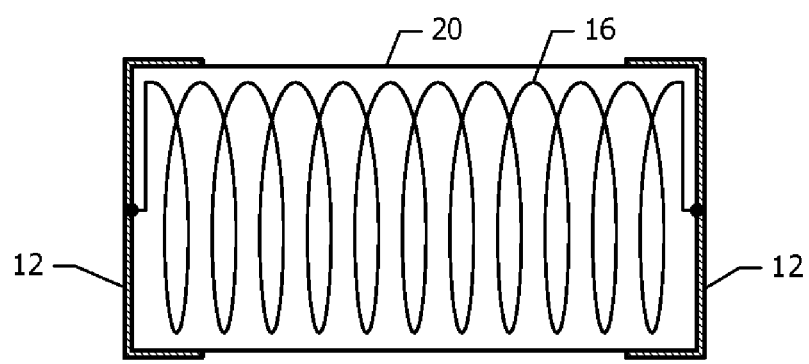
FIG. 4B is a schematic cross-sectional view of a chip inductor according to a second reference example.

FIG. 4A is a schematic cross-sectional view of a chip inductor according to a first reference example, and FIG. 4B is a schematic cross-sectional view of a chip inductor according to a second reference example. In the chip inductors according to the first reference example and the second reference example, the coil 16 is not shifted in any of the upward direction and the downward direction of the multilayer body 20, and the central axis of the coil 16 is located substantially at the center in the height direction of the multilayer body 20. In the first reference example, similarly to the case of the first embodiment (FIG. 2A, FIG. 2B), the outer electrodes 12 are disposed so as to be shifted to the lower side of the multilayer body 20. In the second reference example, similarly to the comparative example (FIG. 3A, FIG. 3B), each outer electrode 12 is disposed on the entirety of the end surface of the multilayer body 20 and on a partial region of each of the upper surface, the bottom surface, and the side surfaces of the multilayer body 20.

Figure 5A:
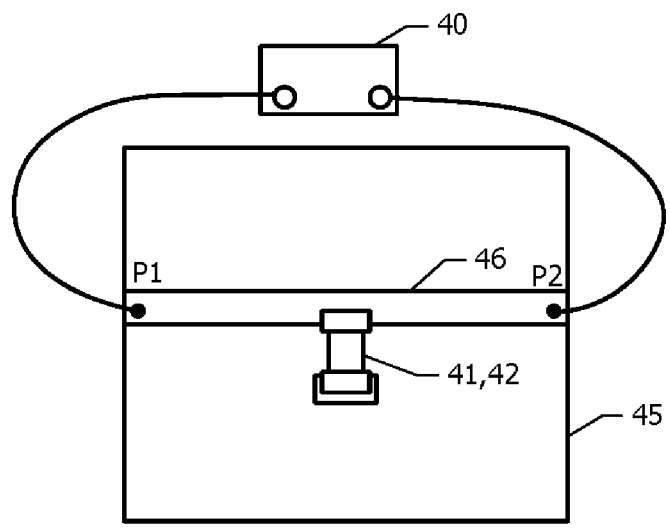
FIG. 5A is a schematic diagram of a measuring system for measuring high frequency characteristics of the chip inductor according to the first reference example and the chip inductor according to the second reference example.
Figure 5B:
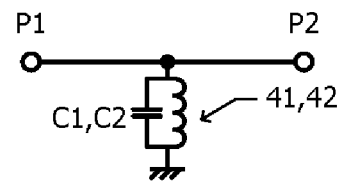
FIG. 5B is an equivalent circuit diagram of the measuring system.

FIG. 5A is a schematic diagram of a measuring system for measuring the high frequency characteristics of the chip inductor 41 according to the first reference example and the chip inductor 42 according to the second reference example. FIG. 5B is an equivalent circuit diagram of the measuring system. The chip inductor 41 or 42 is represented by a parallel circuit of an inductance and the stray capacitance C1 or C2 (FIG. 2D, FIG. 3B).

The measuring system includes a network analyzer 40 and a mounting board 45. A micro stripline 46 is formed on the mounting board 45. A substantially intermediate point of the micro stripline 46 is connected to ground via the chip inductor 41 or 42 to be measured. Transmission characteristics S21 are obtained by inputting a high-frequency signal through one end P1 of the micro stripline 46 and measuring a high-frequency signal outputted to another end P2 of the micro stripline 46.

Figure 5C:
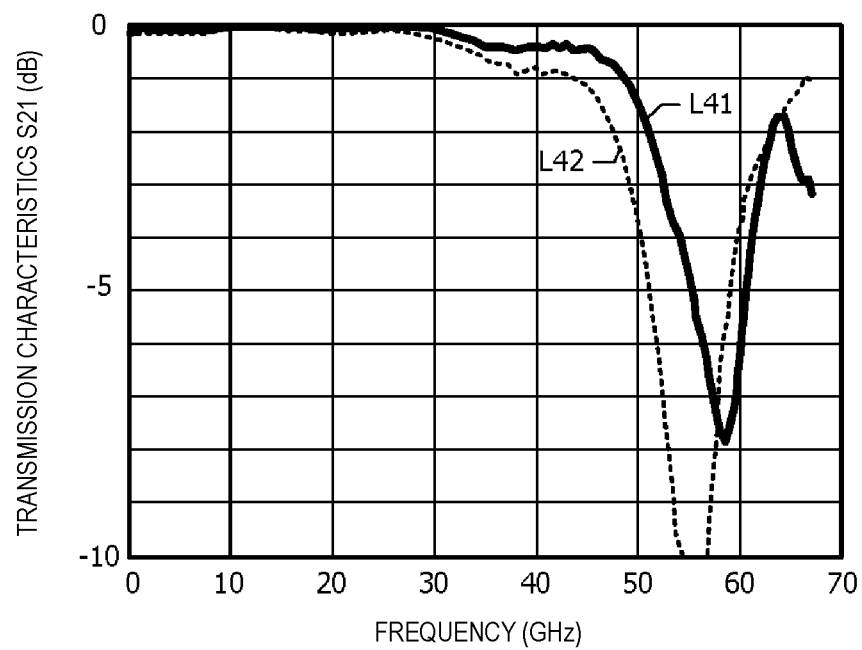
FIG. 5C is a graph showing results of measurement of transmission characteristics S21.

FIG. 5C is a graph showing results of measurement of the transmission characteristics S21. The horizontal axis represents a frequency in the unit of "GHz", and the vertical axis represents the transmission characteristics S21 in the unit of "dB". A solid line L41 indicates the result of measurement when the chip inductor 41 according to the first reference example shown in FIG. 4A was mounted on the mounting board 45 (FIG. 5A), and a broken line L42 indicates the result of measurement when the chip inductor 42 according to the second reference example shown in FIG. 4B was mounted on the mounting board 45 (FIG. 5A). The transmission characteristics S21 being low means that there are many components of a high-frequency signal flowing from the micro stripline 46 through the chip inductor 41 or 42 to ground.

It appears that the transmission characteristics S21 when the chip inductor 41 (FIG. 4A) according to the first reference example was connected to the micro stripline 46 were improved at a frequency of approximately 55 GHz, as compared to the transmission characteristics S21 when the chip inductor 42 (FIG. 4B) according to the second reference example was connected to the micro stripline 46. This means that the chip inductor 41 according to the second reference example allows a high-frequency signal at a frequency of approximately 55 GHz to flow from the micro stripline 46 to ground, more than the chip inductor 41 according to the first reference example. In other words, this means that the chip inductor 41 according to the first reference example has higher characteristics of blocking a high-frequency signal at a frequency of approximately 55 GHz than the chip inductor 42 according to the second reference example.

This difference in blocking characteristics is created due to the fact that the stray capacitance C1 occurring between the coil 16 and each outer electrode 12 of the chip inductor 42 according to the second reference example is larger than the stray capacitance C1 occurring between the coil 16 and each outer electrode 12 of the chip inductor 41 according to the first reference example.

From the experimental test shown in FIGS. 4A to 5C, it is confirmed that the high frequency characteristics are improved by disposing each outer electrode 12 (FIG. 2A, FIG. 2B) so as to be shifted to the lower side of the end surface of the multilayer body 20.

Second Embodiment

Next, a chip inductor according to a second embodiment will be described with reference to FIGS. 6A to 8B. In the following, the description of the configuration common with the chip inductor according to the first embodiment is omitted.

Figure 6A:
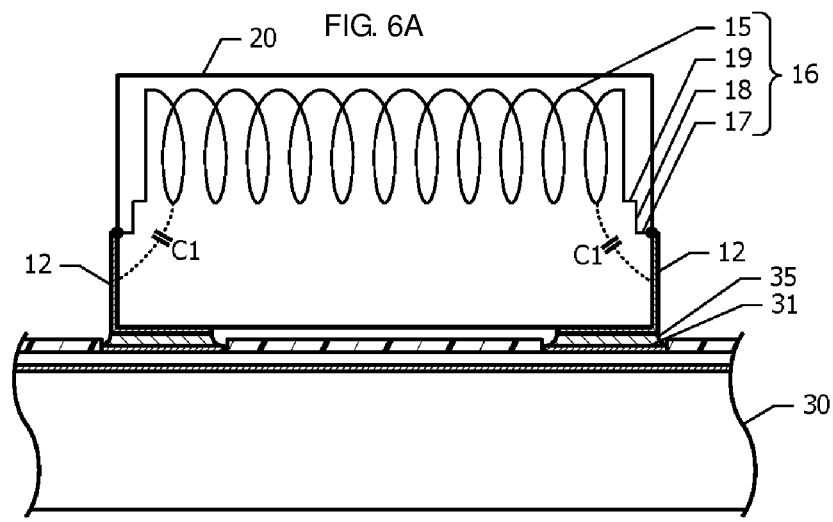
FIG. 6A is a schematic cross-sectional view of a state where a chip inductor according to a second embodiment is mounted on a mounting board.

FIG. 6A is a schematic cross-sectional view of a state where the chip inductor according to the second embodiment is mounted on the mounting board 30. In the first embodiment, as shown in FIG. 2B, the coil 16 is connected to each outer electrode 12 at the substantially same height as that of the lowermost end of the coil 16. On the other hand, in the second embodiment, the coil 16 is connected to each outer electrode 12 at the lower side with respect to the lowermost end of the coil patterns 15.

As shown in FIG. 6A, the coil 16 includes the coil patterns 15 and adjustment patterns 18 at both ends. The adjustment patterns 18 are disposed at outer side portions with respect to the coil patterns 15 at both ends in the lamination direction. The adjustment patterns 18 are connected to the coil patterns 15 at both ends via extended conductors 19 provided in the insulating material layers 10 (FIG. 1). The adjustment patterns 18 extend from both ends of the coil 16 to the lower side with respect to the lower end of the coil patterns 15 and are connected to the outer electrodes 12 via end-portion-extended conductors 17 at the lower side with respect to the lowermost end of the plurality of coil patterns 15. As the extended conductors 19 and the end-portion-extended conductors 17, for example, via conductors filling via holes formed in the insulating material layers 10 and 11 (FIG. 1) are used.

Figure 6B:
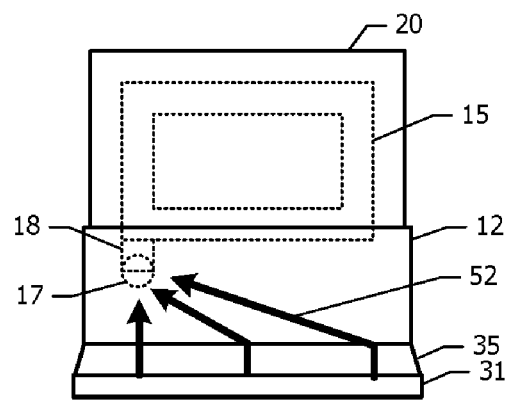
FIGS. 6B and 6C are side views of a state where the chip inductor is mounted on the mounting board.

FIG. 6B is a side view of the chip inductor according to the second embodiment as seen along the lamination direction. The coil patterns 15 and the adjustment patterns 18, which are disposed within the chip inductor, and the end-portion-extended conductors 17, which are hidden by the outer electrodes 12, are shown by dotted lines. When the chip inductor is seen along the lamination direction, the plurality of coil patterns 15 overlap each other and are seen as a substantially single annular shape. The adjustment patterns 18 are extended toward the lower side with respect to the lower end of the coil patterns 15. The end-portion-extended conductors 17 for connecting the coil 16 and the outer electrodes 12 are disposed at the lower ends of the adjustment patterns 18. The adjustment patterns 18 are disposed at the same positions as the ends of the coil patterns 15 in the width direction orthogonal to both the lamination direction and the up-down direction (in the right-left direction in FIG. 6B).

Figure 6C:
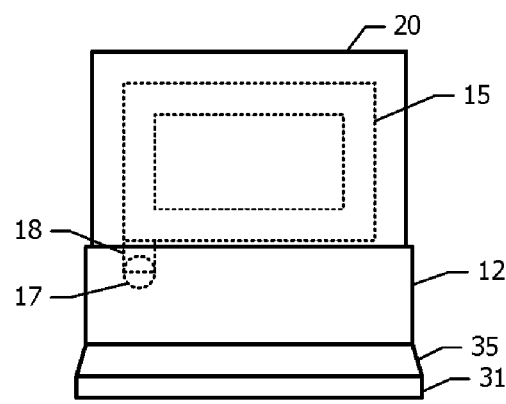

The outer electrodes 12 overlap the entire region of the adjustment patterns 18 and further overlap a part of the coil patterns 15. A portion where the coil patterns 15 and the outer electrodes 12 overlap each other is smaller than the overlapping portion in the first embodiment shown in FIG. 2C. As shown in FIG. 6C, the upper ends of the outer electrodes 12 may be made lower than the lower end of the coil patterns 15, a part of the outer electrodes 12 and a part of the adjustment patterns 18 may overlap each other, and the outer electrodes 12 and the coil patterns 15 may not overlap each other.

Advantageous Effects of Second Embodiment

Next, superior effects of the chip inductor according to the second embodiment will be described. Also in the chip inductor according to the second embodiment, the coil 16 is disposed so as to be shifted to the upper side of the multilayer body 20, and thus the same advantageous effects as those of the chip inductor according to the first embodiment are obtained.

Furthermore, the portions where the coil 16 and the outer electrodes 12 are connected to each other are located at the lower side with respect to the lowermost end of the coil patterns 15, and the portion where the coil patterns 15 and the outer electrodes 12 overlap each other is small. Thus, in the second embodiment, as compared to the first embodiment, the stray capacitance C1 (FIG. 6A) between the coil 16 and each outer electrode 12 of the chip inductor becomes small. Accordingly, it is possible to further enhance the improvement effect of the high frequency characteristics.

First Modification of Second Embodiment

Next, a chip inductor according to a first modification of the second embodiment will be described with reference to FIGS. 7A to 8B. In the following, the description of the configuration common with the chip inductor according to the second embodiment is omitted.

Figure 7A:
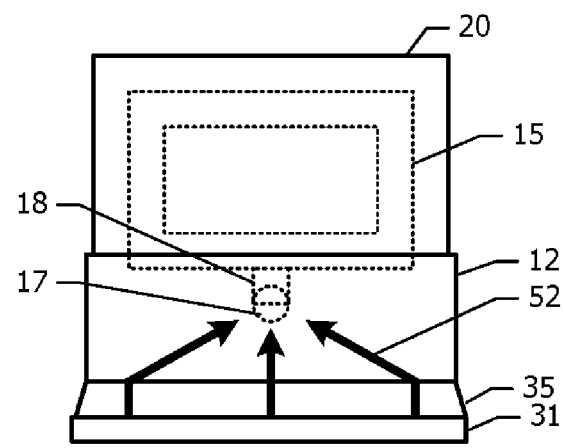
FIGS. 7A and 7B are side views of a state where a chip inductor according to a first modification of the second embodiment is mounted on a mounting board.
Figure 7B:
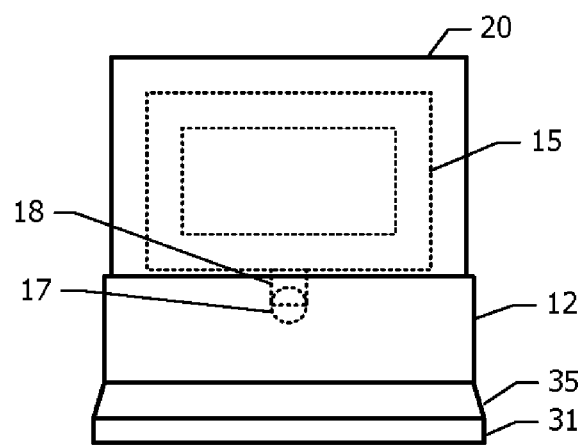

FIG. 7A is a side view of the chip inductor according to the first modification of the second embodiment as seen along the lamination direction. In the second embodiment, as shown in FIG. 6B, the adjustment patterns 18 are disposed at the same position as the ends of the coil patterns 15 in the width direction of the multilayer body 20. In the first modification of the second embodiment, the adjustment patterns 18 are disposed at the same position as the center portions of the coil patterns 15 in the width direction of the multilayer body 20. As shown in FIG. 7B, similarly to the configuration shown in FIG. 6C of the second embodiment, the upper ends of the outer electrodes 12 may be made lower than the lower end of the coil patterns 15, and the outer electrodes 12 and the coil patterns 15 may not overlap each other.

Next, advantageous effects of the first modification of the second embodiment will be described with reference to FIGS. 8A and 8B.

Figure 8A:
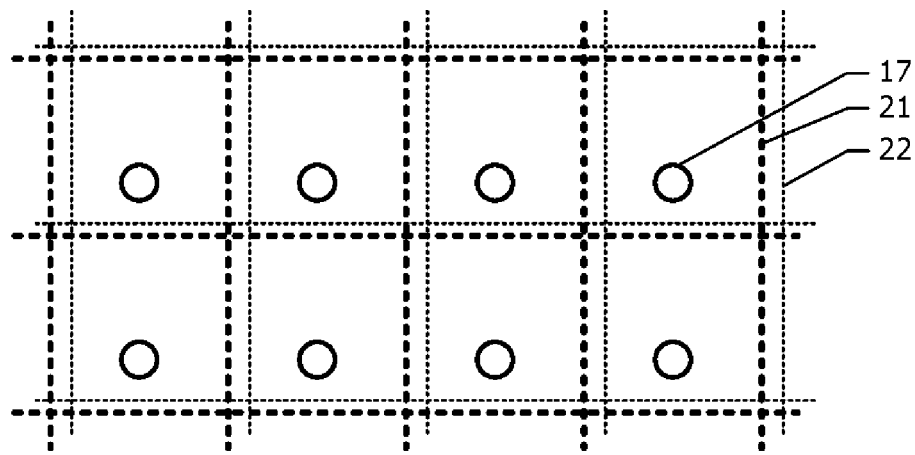
FIG. 8A is a plan view of a multilayer body before cutting the chip inductor according to the first modification of the second embodiment.

FIG. 8A is a plan view of a multilayer body before cutting the chip inductor according to the first modification of the second embodiment. A plurality of chip inductors are arranged in a matrix manner within the surface of the sheet-like multilayer body. The sheet-like multilayer body is separated into individual chip inductors by cutting the sheet-like multilayer body at a cutting position 21 with a guillotine cutter, a dicer, or the like. The end-portion-extended conductors 17 for connecting the coil 16 and the outer electrodes 12 (FIG. 6A) are disposed substantially at the center portion in the width direction of each chip inductor. Due to misalignment of the cutting position on the multilayer body, an actual cutting position 22 may be shifted from the cutting position 21 that is a target.

Figure 8B:
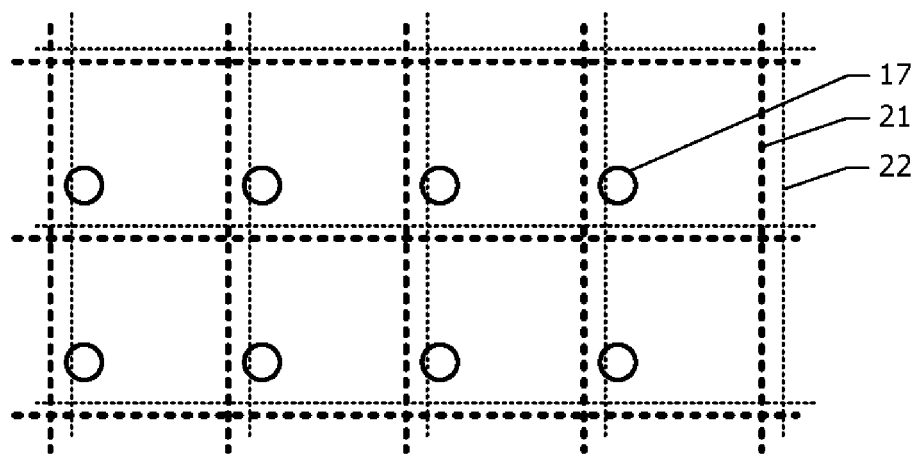
FIG. 8B is a plan view of a multilayer body before cutting a chip inductor according to a comparative example.

FIG. 8B is a plan view of a multilayer body before cutting a chip inductor according to a comparative example. In the comparative example, the end-portion-extended conductors 17 for connecting the coil 16 and the outer electrodes 12 (FIG. 6A) are disposed near ends in the width direction of each chip inductor. The interval in the width direction between the cutting position 21, which is a target, and the end-portion-extended conductor 17 is narrow, so that a possibility increases that the cutting position 22 will pass through the end-portion-extended conductor 17 when the actual cutting position 22 is shifted in the width direction from the cutting position 21, which is a target.

When the actual cutting position 22 passes through the end-portion-extended conductor 17, the area of contact at a location of connection between the outer electrode 12 and the coil 16 decreases. When a high current flows to the chip inductor, a wire breakage easily occurs at the location of connection between the outer electrode 12 and the coil 16. When the area of contact at the location of connection between the outer electrode 12 and the coil 16 decreases, a wire breakage more easily occurs at the location at which a wire breakage easily occurs. In addition, when the area of contact decreases, the contact resistance at the location of connection increases, and thus the direct current resistance of the chip inductor increases.

In the first modification of the second embodiment, as shown in FIG. 8A, the interval in the width direction between the cutting position 21, which is a target, and the end-portion-extended conductor 17 is wider than that in the comparative example shown in FIG. 8B. Thus, even when the actual cutting position 22 is shifted in the width direction from the cutting position 21, which is a target, an event in which the cutting position 22 passes through the end-portion-extended conductor 17 is less likely to occur. Accordingly, it is possible to suppress an increase in the direct current resistance of the chip inductor and occurrence of a wire breakage due to a decrease in the area of contact at the location of connection between the coil 16 and the outer electrode 12.

Generally, the outer electrodes 12 of the chip inductor are formed by a dip coating method, a method of pushing up a conductive paste embedded in a groove, or the like. In the case where any of the methods is adopted, processing variations, for example, variations in thickness, during formation of the outer electrodes 12 increase as the distance from the center portion in the width direction on the end surface of the multilayer body (FIG. 7A, FIG. 7B) increases. In the first modification of the second embodiment, since the end-portion-extended conductors are disposed at the center portion in the width direction, processing variations of the outer electrodes 12 are reduced at the locations of connection between the end-portion-extended conductors 17 and the outer electrodes 12. Thus, it is possible to suppress a decrease in reliability due to processing variations of the outer electrodes 12.

In FIGS. 6B and 7A, a current path 52 from the land 31 of the mounting board 30 (FIG. 6A) toward the coil 16 is shown by a plurality of arrows. When each end-portion-extended conductor 17 is disposed substantially at the center portion in the width direction as in the chip inductor according to the first modification of the second embodiment, the average length of the current path 52 from the land 31 to the end-portion-extended conductor 17 is shorter than that in the case where each end-portion-extended conductor 17 is disposed at the end (FIG. 6B). Thus, it is possible to reduce the direct current resistance of the chip inductor.

In the first modification of the second embodiment, the "center portion" does not mean a geometrically exact center. The "center portion" means a position that is closer to the exact center than the end and at which the aforementioned effects are obtained. For example, a portion between positions shifted from the exact center toward the right and left ends in the width direction by variations due to processing accuracy, for example, by 40 μm, may be defined as the "center portion".

Other Modifications of Second Embodiment

Figure 9A:
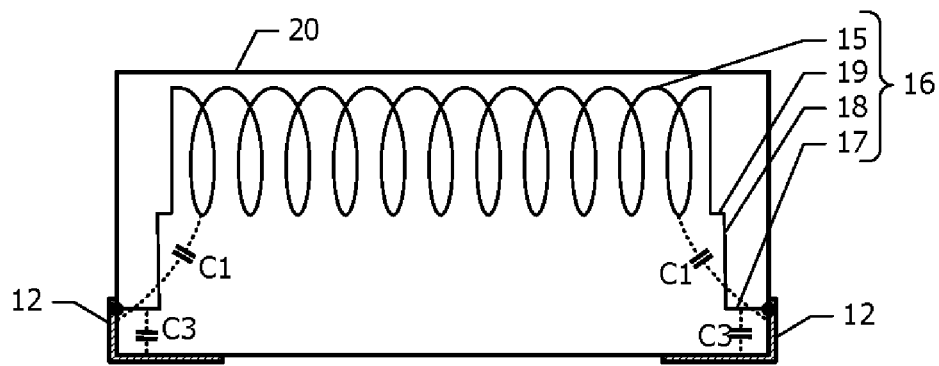
FIGS. 9A to 9C are schematic cross-sectional views of chip inductors according to other modifications of the second embodiment.
Figure 9B:
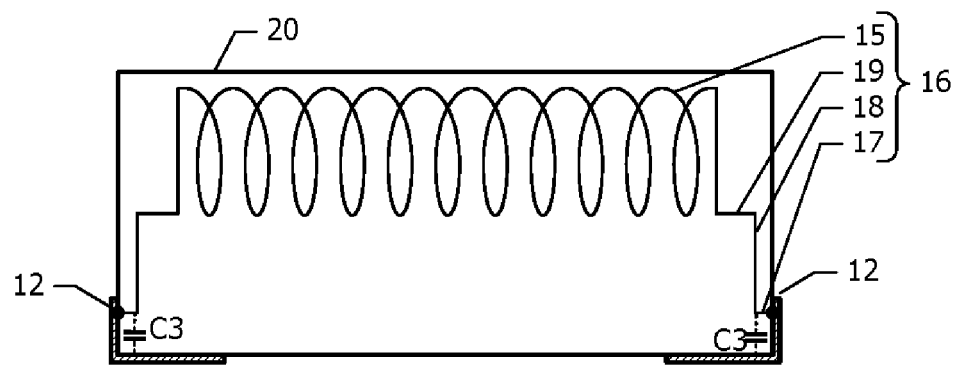
Figure 9C:
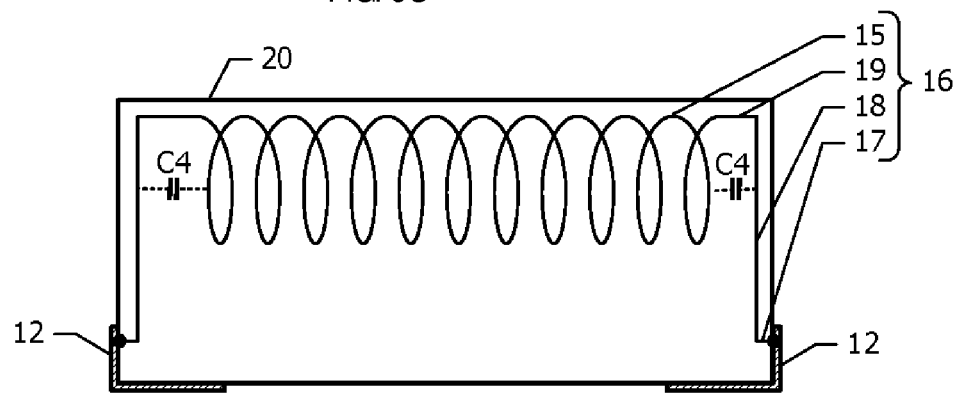

Next, chip inductors according to other modifications of the second embodiment will be described with reference to FIGS. 9A to 9C. FIGS. 9A to 9C are schematic cross-sectional views of the chip inductors according to the respective modifications. In the following, the description of the configuration common with the chip inductor according to the second embodiment is omitted.

In the modification shown in FIG. 9A, the adjustment patterns 18 are extended lower than those in the chip inductor according to the second embodiment shown in FIG. 6A. The location of connection between the coil 16 and each outer electrode 12 is located lower than that in the second embodiment. The upper end of each outer electrode 12 is also located lower than that in the second embodiment. Thus, it is possible to further reduce the stray capacitance C1 between the coil 16 and each outer electrode 12. However, the distance from each end-portion-extended conductor 17, which connects the lower end of the adjustment pattern 18 and the outer electrode 12, to the bottom surface of the multilayer body 20 becomes short. Thus, a stray capacitance C3 between each outer electrode 12 provided on the bottom surface of the multilayer body 20 and each end-portion-extended conductor 17 becomes unneglectable.

In the modification shown in FIG. 9B, the location of connection between the coil 16 and each outer electrode 12 and the position of the upper end of each outer electrode 12 are the same as those in the case of the modification shown in FIG. 9A. In the modification shown in FIG. 9B, the dimension (length) in the lamination direction of each end-portion-extended conductor is smaller than that in the modification shown in FIG. 9A. Thus, it is possible to reduce the stray capacitance C3 between each end-portion-extended conductor 17 and each outer electrode 12 provided on the bottom surface of the multilayer body 20. In order to make the stray capacitance C3 as small as possible, each end-portion-extended conductor 17 is preferably shortened. For example, it is possible to shorten each end-portion-extended conductor 17 by thinning the insulating material layer provided with the via hole in which the end-portion-extended conductor 17 is housed.

However, when the insulating material layer provided with the via hole in which the end-portion-extended conductor 17 is housed is excessively thinned, peeling-off of the insulating material layer easily occurs in a cutting step of separation into a chip. In order to suppress occurrence of peeling-off of the insulating material layer, the thickness of the insulating material layer provided with the via hole in which the end-portion-extended conductor 17 is housed is preferably made equal to or larger than the sum of the thicknesses of the coil patterns 15 and the thickness between the coil patterns 15 adjacent to each other.

When the sum of the length of each extended conductor 19 and the length of each end-portion-extended conductor 17 is made constant, the end-portion-extended conductor 17 is preferably made shorter than the extended conductor 19. It is possible to adjust the lengths of the end-portion-extended conductors 17 and the extended conductors 19 by adjusting the thicknesses or the number of the insulating material layers provided with the via holes in which the end-portion-extended conductors 17 and the extended conductors 19 are housed.

In the example shown in FIG. 9C, the extended conductors 19, which connect the adjustment patterns 18 and the coil patterns 15 at both ends, are disposed at the same height as the highest position of the coil patterns 15. By disposing the extended conductors 19 at the high positions, it is possible to reduce the stray capacitance between each extended conductor and the mounting board 30. By lengthening each extended conductor 19 to widen the interval between each coil pattern 15 and each adjustment pattern 18, it is possible to reduce a stray capacitance C4 between each coil pattern 15 and each adjustment pattern 18.

Third Embodiment

Next, a chip inductor according to a third embodiment will be described with reference to FIG. 10. In the following, the description of the configuration common with the chip inductor according to the first embodiment is omitted.

FIG. 10 is a schematic cross-sectional view of a state where the chip inductor according to the third embodiment is mounted on the mounting board 30. In the first embodiment, a conductive film formed on the end surface and the bottom surface of the multilayer body 20 is used as each outer electrode 12 (FIG. 2A, FIG. 2B). In the third embodiment, the outer electrodes 12 include conductive films 12A formed on the end surfaces and the bottom surface of the multilayer body 20, and conductive members 12B disposed at both ends of the multilayer body 20.

The configuration of each conductive film 12A is the same as the configuration of each outer electrode 12 (FIG. 2A, FIG. 2B) of the chip inductor according to the first embodiment. Each conductive member 12B is attached to the conductive film 12A, and the lower end of each conductive member 12B extends to a position lower than the bottom surface of the multilayer body 20. Each conductive member 12B is connected to the conductive film 12A, for example, by means of solder having a higher melting point than the solder 35, which is used in mounting the chip inductor onto the mounting board 30.

The lower end of each conductive member 12B is bent in a substantially L shape to be formed as a fixed portion 12C. The fixed portion 12C is fixed to the land 31 of the mounting board 30 by means of the solder 35 or the like, whereby the chip inductor is mounted onto the mounting board 30. The multilayer body 20 is supported by the mounting board 30 in a state where the multilayer body 20 is spaced apart from the mounting board 30 at an interval by the conductive members 12B. The conductive members 12B have mechanical strength (rigidity) sufficient to mechanically support the multilayer body 20 so as to raise the multilayer body 20 from the mounting board 30.

Next, superior effects of the third embodiment will be described. In the third embodiment, the distance from the conductor 33 provided in or on the mounting board 30 to the coil 16 is longer than that in the first embodiment. Thus, the stray capacitance C2 occurring between the conductor 33 and the coil 16 is smaller than that in the first embodiment. As a result, it is possible to further improve the high frequency characteristics of the chip inductor.

Fourth Embodiment

Next, a chip inductor according to a fourth embodiment will be described with reference to FIGS. 11A and 11B. In the following, the description of the configuration common with the chip inductor according to the third embodiment is omitted.

Figure 11A:
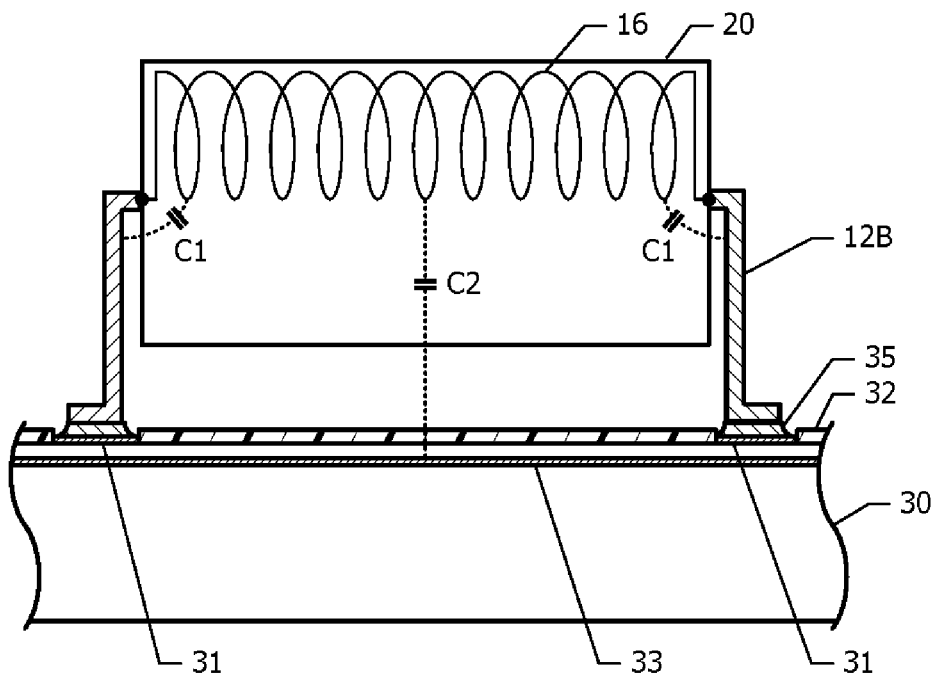
FIG. 11A is a schematic cross-sectional view of a state where a chip inductor according to a fourth embodiment is mounted on a mounting board.

FIG. 11A is a schematic cross-sectional view of a state where the chip inductor according to the fourth embodiment is mounted on the mounting board 30. In the third embodiment, as shown in FIG. 10, the outer electrodes 12 include the conductive films 12A formed on the end surfaces and the bottom surface of the multilayer body 20, and the conductive members 12B supporting the multilayer body 20 so as to raise the multilayer body 20 from the mounting board 30. In the fourth embodiment, the conductive films 12A (FIG. 10) are not formed on the end surfaces and the bottom surface of the multilayer body 20, and the outer electrodes 12 are composed of only the conductive members 12B having mechanical strength sufficient to support the multilayer body 20.

The upper end of each conductive member 12B is bent in a substantially L shape, and each conductive member 12B is fixed to the multilayer body 20 at the end of the bent portion thereof. A gap is ensured between the end surface of the multilayer body 20 and each conductive member 12B below a location at which each conductive member 12B and the multilayer body 20 are fixed to each other. The configuration of the fixed portion 12C at the lower end of each conductive member 12B is the same as the configuration of each conductive member 12B of the chip inductor according to the third embodiment.

Figure 11B:
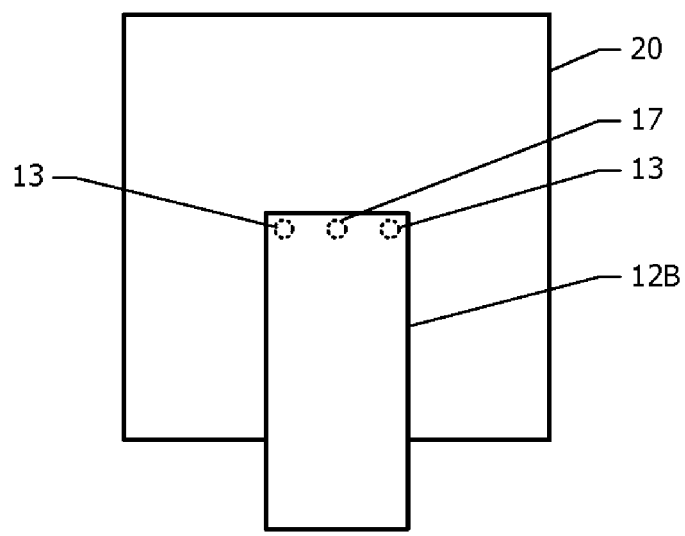
FIG. 11B is a side view of the chip inductor according to the fourth embodiment.

FIG. 11B is a side view of the chip inductor according to the fourth embodiment. The end-portion-extended conductor 17 connected to the coil 16 (FIG. 11A) is exposed in the end surface of the multilayer body 20. Furthermore, a conductive land 13 that is not connected to the coil 16 is printed on the end surface of the multilayer body 20. The conductive member 12B is connected to the end-portion-extended conductor 17 and the land 13 at the upper end thereof and is mechanically fixed to the multilayer body 20. For the connection between the end-portion-extended conductor 17 and the land 13 to the conductive member 12B, for example, solder having a higher melting point than the solder 35 (FIG. 11A), which is used in mounting the chip inductor onto the mounting board 30, may be used. The land serves to enhance the strength with which the conductive member 12B is attached to the multilayer body 20. In order to enhance the strength with which the conductive member 12B is attached to the multilayer body 20, a plurality of lands 13 are preferably disposed.

Next, superior effects of the fourth embodiment will be described. In the fourth embodiment, as shown in FIG. 11A, each conductive member 12B is raised from the end surface of the multilayer body 20 below the location at which each conductive member 12B and the multilayer body 20 are connected to each other, and thus it is possible to reduce the stray capacitance C1 occurring between the coil 16 and each conductive member 12B.

Next, a modification of the fourth embodiment will be described. In the fourth embodiment, the coil 16 and each conductive member 12B are connected to each other via the one end-portion-extended conductor 17, but a plurality of end-portion-extended conductors 17 may be provided. For example, the end-portion-extended conductors 17 may be provided at the positions of the lands 13 in the side view shown in FIG. 11B. In this modification, the strength with which the conductive member 12B is attached to the multilayer body 20 is substantially equal to that in the fourth embodiment shown in FIG. 11B. Furthermore, since the coil 16 and the conductive member 12B are electrically connected to each other by the plurality of end-portion-extended conductors 17, it is possible to enhance the reliability of electrical connection between the coil 16 and the conductive member 12B.

Fifth Embodiment

Next, a chip inductor according to a fifth embodiment and chip inductors according to modifications of the fifth embodiment will be described with reference to FIGS. 12A to 12D. In the following, the description of the configuration common with the chip inductor (FIG. 1 and FIGS. 2A to 2D) according to the first embodiment is omitted.

Figure 12A:
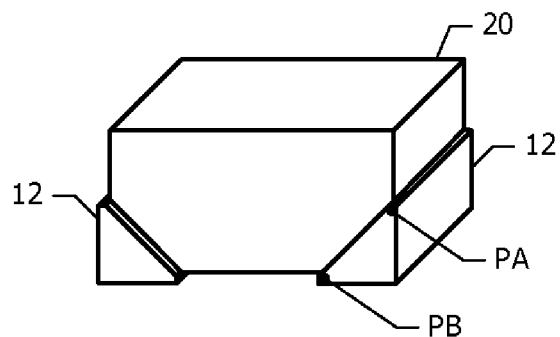
FIG. 12A is a perspective view of a chip inductor according to a fifth embodiment.

FIG. 12A is a perspective view of the chip inductor according to the fifth embodiment. In the first embodiment, each outer electrode 12 (FIG. 2A) is formed on the end surface and the bottom surface of the multilayer body 20. However, in the fifth embodiment, each outer electrode 12 is formed so as to extend around to a part of the side surface of the multilayer body 20. A side surface portion of the outer electrode 12 is formed in a region below a straight line connecting an upper end PA of the outer electrode 12 formed on the end surface and an inner end PB of the outer electrode 12 formed on the bottom surface. As a result, the shape of the portion of the outer electrode 12 that extends around to the side surface is a substantially right-angled triangle.

Figure 12B:
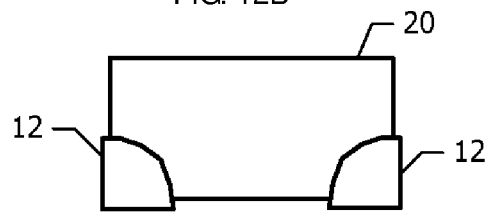
FIGS. 12B to 12D are front views of chip inductors according to modifications of the fifth embodiment.
Figure 12C:
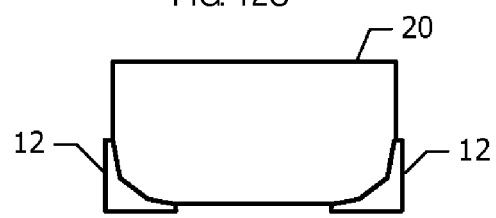
Figure 12D:
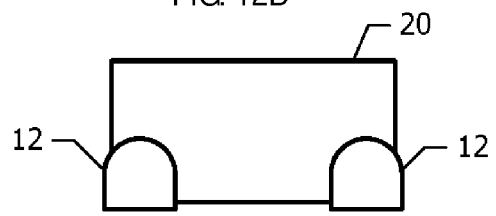

FIGS. 12B to 12D are front views of the chip inductors according to the modifications of the fifth embodiment. In the modification shown in FIG. 12B, each outer electrode 12 formed on the side surface has a shape in which the hypotenuse of a substantially right-angled triangle is expanded outward. In the modification shown in FIG. 12C, each outer electrode 12 formed on the side surface has a shape in which the hypotenuse of a substantially right-angled triangle is curved inwardly. In the modification shown in FIG. 12D, each outer electrode 12 formed on the side surface has a shape in which the upside of a substantially rectangular shape is deformed into a substantially arched shape.

As shown in FIGS. 12B to 12D, the line connecting the upper end PA (FIG. 12A) of the outer electrode 12 formed on the end surface and the inner end PB (FIG. 12A) of the outer electrode 12 formed on the bottom surface may be one of various curves, and the side surface portion of the outer electrode 12 may be formed in a region below the curve.

Each embodiment is illustrative, it is needless to say that the components shown in the different embodiments may be partially replaced or combined. The same advantageous effects achieved by the same configuration in multiple embodiments are not mentioned successively in each embodiment. Furthermore, the present disclosure is not limited to the above-described embodiments. For example, it is obvious to a person skilled in the art that various changes, modifications, combinations, etc. may be made.

While preferred embodiments of the disclosure have been described above, it is to be understood that variations and modifications will be apparent to those skilled in the art without departing from the scope and spirit of the disclosure. The scope of the disclosure, therefore, is to be determined solely by the following claims.

What is claimed is:

1. A chip inductor comprising:
a multilayer body including a plurality of laminated insulating material layers on which a plurality of coil patterns are provided, the plurality of coil patterns being connected to each other to form a coil having a bottom end and a coil axis parallel to a lamination direction;
a pair of outer electrodes disposed at both ends of the multilayer body in the lamination direction, respectively, and the multilayer body having via holes formed in the insulating material layers that are between the outer electrodes and the coil; and
end-portion-extended conductors that fill the via holes, are below the bottom end of the coil and connect the outer electrodes to the coil, wherein
when a direction orthogonal to the lamination direction is defined in an up-down direction, the coil patterns are disposed within the multilayer body so as to be shifted to an upper side, and
at least a portion, at the upper side, of a vertical projection image of the coil on a virtual plane orthogonal to the lamination direction does not overlap a vertical projection image of the outer electrodes on the virtual plane.

2. The chip inductor according to claim 1, wherein the pair of outer electrodes are disposed so as to be shifted to a lower side based on the multilayer body and are formed on surfaces of the multilayer body at both ends in the lamination direction.

3. The chip inductor according to claim 1, wherein the coil and the outer electrodes are connected to each other at a lower side with respect to a lowermost end of the coil patterns in the lamination direction.

4. The chip inductor according to claim 1, wherein the coil is connected to the outer electrodes at a center portion of the coil in a width direction orthogonal to both the lamination direction and the up-down direction.

5. The chip inductor according to claim 1, wherein the pair of outer electrodes include a pair of conductive members connected to the coil, each of the conductive members includes a fixed portion fixed to a mounting board, and the multilayer body is supported by the mounting board in a state where the multilayer body is spaced apart from the mounting board at an interval, when the fixed portion is fixed to the mounting board.

6. The chip inductor according to claim 1, wherein a dimension in the up-down direction of the multilayer body is larger than a dimension thereof in a width direction orthogonal to the lamination direction.

\* \* \* \* \*